United States Patent [19]

Ruskouski

[11] Patent Number: 5,410,453
[45] Date of Patent: Apr. 25, 1995

[54] LIGHTING DEVICE USED IN AN EXIT SIGN

[75] Inventor: Charles R. Ruskouski, Danbury, Conn.

[73] Assignee: General Signal Corporation, Stamford, Conn.

[21] Appl. No.: 160,583

[22] Filed: Dec. 1, 1993

[51] Int. Cl.⁶ .............................................. F21V 17/04
[52] U.S. Cl. ...................................... 362/20; 362/249; 362/240; 362/800; 362/812; 40/570
[58] Field of Search .................. 362/812, 800, 31, 20, 362/240, 250, 249; 40/570, 564, 580, 573

[56] References Cited

U.S. PATENT DOCUMENTS

| | | | |
|---|---|---|---|
| 844,087 | 2/1907 | Bellamy | 40/580 |
| 859,199 | 7/1907 | Chinnery | 40/563 |
| 2,915,844 | 12/1959 | Thomas | 40/563 |
| 3,309,806 | 3/1967 | Gallagher | 40/570 |
| 3,324,290 | 6/1967 | Lasker | 40/563 |
| 3,560,729 | 2/1971 | Liberman | 362/294 |
| 3,864,861 | 2/1975 | Hill, Jr. | 40/576 |
| 4,139,957 | 2/1979 | Minogue et al. | 40/573 |
| 4,211,955 | 7/1980 | Ray | 315/53 |
| 4,234,914 | 11/1980 | Boesen | 40/550 |
| 4,254,453 | 3/1981 | Mouyard et al. | 362/240 |
| 4,259,800 | 4/1981 | Schoenfeld | 40/573 |
| 4,271,408 | 6/1981 | Teshima et al. | 362/812 |
| 4,298,869 | 11/1981 | Okuno | 340/782 |
| 4,345,308 | 8/1982 | Mouyard et al. | 362/246 |
| 4,383,382 | 5/1983 | Hegarty | 40/545 |
| 4,435,743 | 3/1984 | Plumly | 362/240 |
| 4,443,835 | 4/1984 | Bräutigam et al. | 362/300 |
| 4,630,183 | 12/1986 | Fujita | 362/311 |
| 4,682,147 | 7/1987 | Bowman | 340/286 |
| 4,720,709 | 1/1988 | Imamura et al. | 40/573 |
| 4,724,629 | 2/1988 | Walton | 40/451 |
| 4,727,289 | 2/1988 | Uchida | 315/71 |
| 4,768,300 | 9/1988 | Rutili | 40/546 |
| 4,782,429 | 11/1988 | Walton et al. | 362/20 |
| 4,849,864 | 7/1989 | Forrest | 362/427 |
| 4,884,178 | 11/1989 | Roberts | 362/242 |
| 4,929,866 | 5/1990 | Murata et al. | 313/500 |
| 4,951,406 | 8/1990 | Lemire | 40/576 |
| 4,965,457 | 10/1990 | Wrobel et al. | 362/249 |
| 4,967,317 | 10/1990 | Plumly | 40/570 |
| 5,012,157 | 4/1991 | Walton et al. | 315/66 |
| 5,018,290 | 5/1991 | Kozek et al. | 40/570 |
| 5,020,252 | 6/1991 | De Boef | 40/564 |
| 5,036,248 | 7/1991 | McEwan et al. | 313/500 |
| 5,105,568 | 4/1992 | Branning | 40/570 |
| 5,136,483 | 8/1992 | Schöniger et al. | 362/61 |
| 5,160,201 | 11/1992 | Wrobel | 362/249 |
| 5,268,828 | 12/1993 | Miura | 362/800 |
| 5,276,591 | 1/1994 | Hegarty | 362/31 |
| 5,299,109 | 3/1994 | Grondal | 362/241 |
| 5,303,124 | 4/1994 | Wrobel | 40/570 |

FOREIGN PATENT DOCUMENTS 22990 of 0000 United Kingdom .

OTHER PUBLICATIONS

Brochure–The Lumacell Leader (LER Universal Retrofit Module).
LPR Installation Instructions–Isolite.
Brochure–Model LPR Retrofit Module–Isolite.
Brochure–The Lumacell Leader (LER Series Module).
Brochure–Isolite's New LitePak.
Brochure–Astralite 2000 LED Exit Sign Retrofit Kit Single Sided L.E.D. Retrofit Kit Instructions.
Dual-Lite brochure–We've Created A Masterpiece. Again.

Primary Examiner—Ira S. Lazarus
Assistant Examiner—Thomas M. Sember
Attorney, Agent, or Firm—Ware, Fressola, Van Der Sluys & Adolphson

[57] ABSTRACT

In a lighting fixture such as an exit sign, a light emitting diode lighting device is provided for mating engagement with an electrical socket of the lighting fixture. The light emitting diode device has a plurality of light emitting diodes recessed in apertures for directing light into a desired illumination pattern.

37 Claims, 5 Drawing Sheets

LIGHTING DEVICE USED IN AN EXIT SIGN

BACKGROUND OF THE INVENTION

The present invention relates generally to electrical lighting sources and, more particularly, to electrical lighting sources in illuminated exit signs.

Under current local fire and building codes, buildings to which the public has access are required to have signage therein identifying the exits. Most of these signs are required to exhibit a specific amount of illumination and, oftentimes, must have an emergency backup power source to provide emergency illumination to the light for a specified period of time during periods when utility power to the building is discontinued, thereby facilitating egress of persons from the building.

Traditionally, two 15-watt incandescent lamps driven by 120 volt alternating current (120 VAC) have been employed to provide normal illumination while two 3.6-watt incandescent lamps driven by a self contained emergency battery power supply are used for illumination during power failure situations. A switching or transfer device will automatically operate the emergency backup illumination system when a power failure is detected.

While these traditional exit sign lighting arrangements perform adequately, they do have a few drawbacks. A major drawback is that the incandescent bulbs use large amounts of electric power thus requiring a relatively large emergency battery power supply for use during emergency lighting situations. Furthermore, while the incandescent bulbs provide adequate illumination, such bulbs do not have a long life in service and require frequent replacement.

To alleviate the drawbacks associated with incandescent bulbs, many manufacturers are beginning to utilize light emitting diodes (LEDs) rather than incandescent bulbs in exit signs. Each light emitting diode provides a relatively small amount of light as compared to the traditional incandescent bulbs whereby a large number of light emitting diodes must be used to provide the same amount of illumination offered by the traditional incandescent bulbs.

It is an object of the present invention to provide a novel lighting device for an exit sign using a plurality of light emitting diodes.

It is also an object to provide such a lighting device which allows the light emitting diodes to be powered by both the normal utility electrical power (120 VAC) and, during emergency power situations, an emergency battery power supply and associated charging and transfer circuitry.

Still another object is to provide such a lighting device in which the light emitting diodes are arranged in the exit sign to provide the amount of illumination required by building codes.

A further object is to provide such a lighting device which may be readily and economically fabricated and will enjoy a long life in operation.

SUMMARY OF THE INVENTION

It has now been found that the foregoing and related objects can be readily attained in an exit sign having a sign housing, an electrical socket in the sign housing and a lighting device matingly engaged with the electrical socket. The sign housing defines an enclosure therein and has indicia to be illuminated. The lighting device is in the lighting device housing and has a plurality of light directing apertures in one side thereof with at least one light emitting diode recessed in each of the plurality of light directing apertures, whereby light from the light emitting diodes is directed by the light directing apertures into the enclosure of the sign housing to illuminate the indicia. The lighting device also has a mounting base assembly on the lighting device housing for electrically connecting the light emitting diodes to the electrical socket. The mounting base assembly is matingly received in the electrical socket through relative rotational and axial movement therebetween. The mounting base assembly permits orientation of the lighting device housing relative to the mounting base assembly and the sign housing.

According to the invention, each of the light directing apertures have a frustoconical shape. The frustoconical shape has an angle of about twenty three degrees with its vertex. The vertices of the apertures can extend parallel to one another but also at least some of the apertures can be skewed relative to one another.

Ideally, the plurality of light emitting diodes are mounted on a printed circuit board positioned in a slot in the lighting device housing. The printed circuit board is electrically connected to the mounting base assembly and has electrical components thereon for the light emitting diodes.

In accordance with the present invention, a primary electric power circuit is operationally connected to the electrical socket for supplying power to the lighting device while an emergency electric power circuit is operationally connected to the primary electric power circuit to detect failure thereof and thereafter provided auxiliary power to the lighting device through the electrical socket. The emergency electric power circuit includes a plurality of rechargeable batteries and a charging device for keeping the rechargeable batteries fully charged during periods of nonuse.

Desirably, a second lighting device identical to the first lighting device is provided within the enclosure spaced from the first lighting device. The two lighting devices have their respective apertures facing one another and cooperate to fully illuminate the indicia.

The invention will be fully understood when reference is made to the following detailed description taken in conjunction with the accompanying drawings.

DETAILED DESCRIPTION OF THE INVENTION

Figure 1:
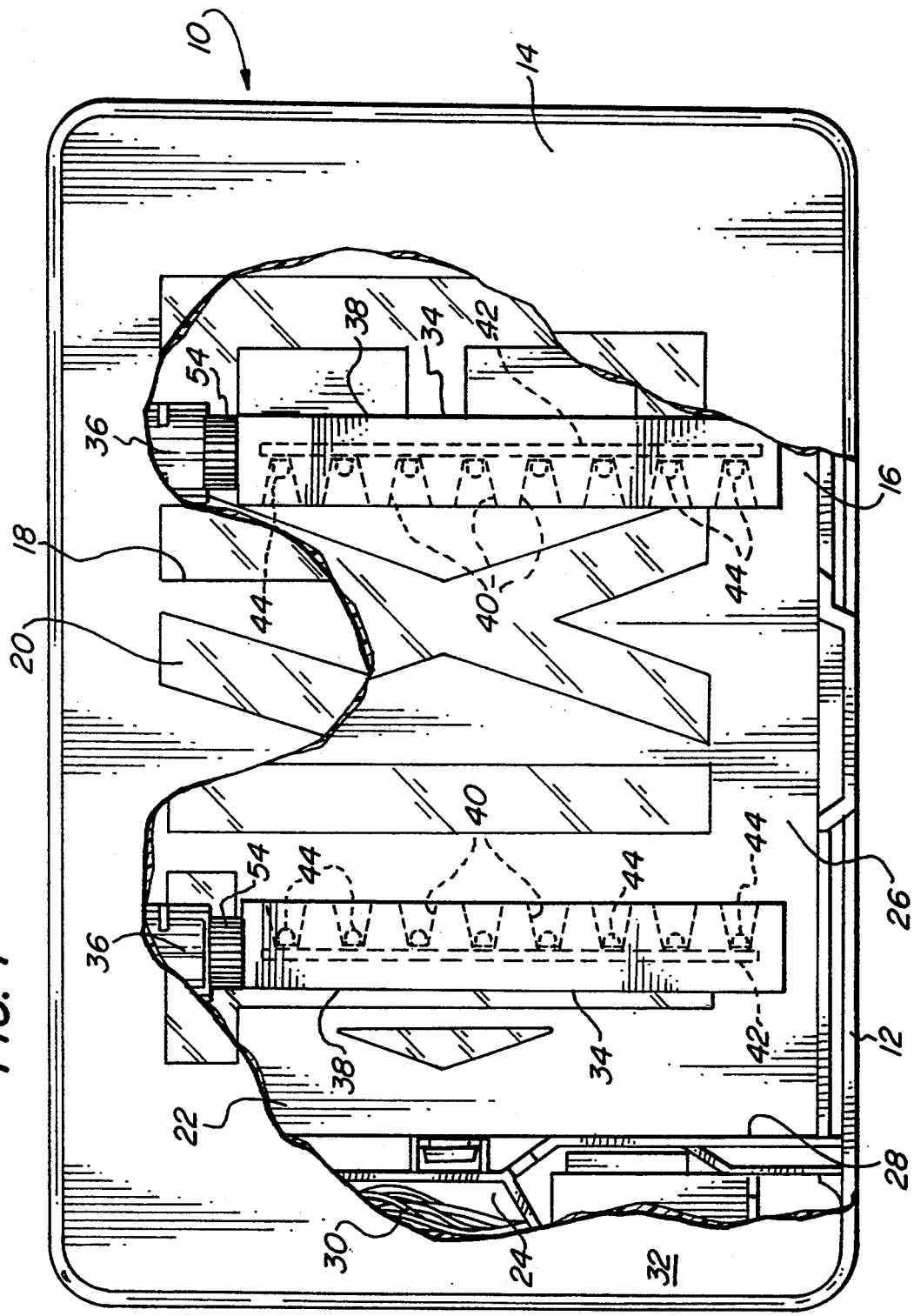
FIG. 1 is a side elevational view of an exit sign housing with portions removed and broken away to illustrate internal structure including two light emitting diode lighting devices made in accordance with the present invention.
Figure 2:
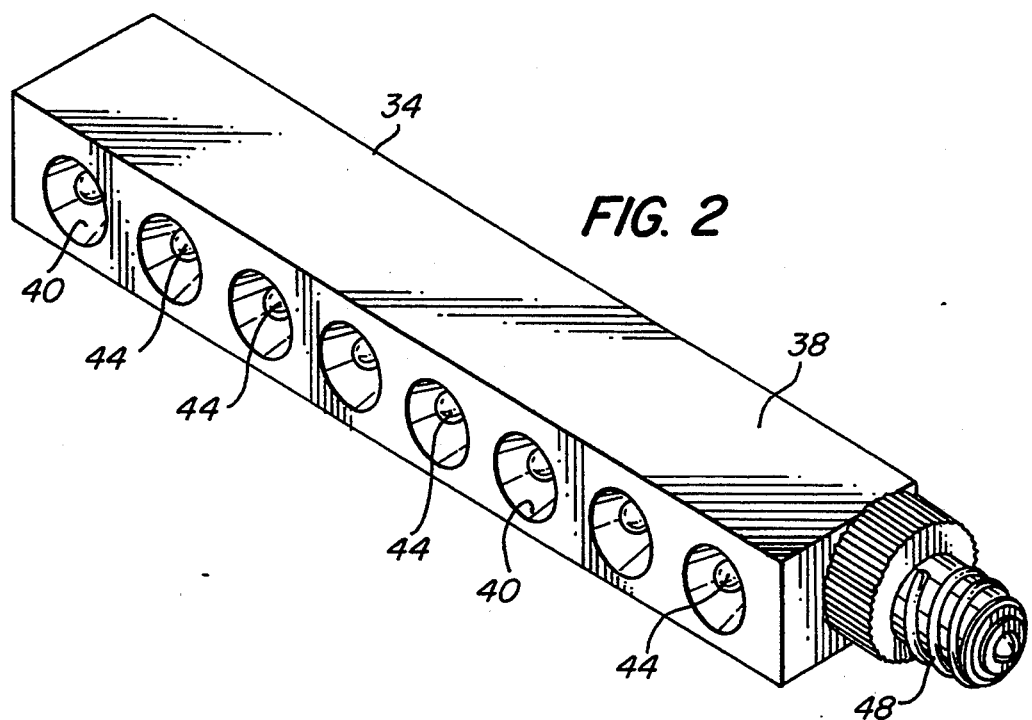
FIG. 2 is a perspective view of one of the light emitting diode lighting devices from the exit sign of FIG. 1.
Figure 3:
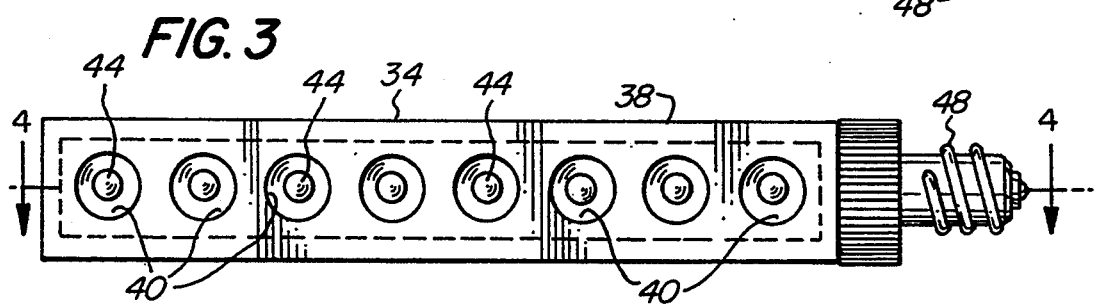
FIG. 3 is a side elevational view of the light emitting diode lighting device of the present invention.

Referring first to FIG. 1 of the drawings, therein illustrated is an exit sign generally designated by the numeral 10. The exit sign 10 is mountable to both a canopy bracket (not shown) and a standard electrical junction box (not shown) in a manner explained in copending U.S. patent application Ser. No. 07/925,313, entitled CANOPY MOUNTING DEVICE FOR EXIT SIGNS AND THE LIKE. With this arrangement, the exit sign construction of this invention can be mounted directly to a standard electrical junction box found in a ceiling or wall of a building in any desired location.

The exit sign 10 comprises a central rectangularly shaped frame 12 with front and back cover members 14 and 16, at least one of which incorporates a large stencil 18 having the letters "EXIT" in the major surface thereof and a colored plastic diffuser 20 therebehind. The central rectangularly shaped frame 12 and the front and back cover members 14 and 16 are snap-fit together and cooperate to form a housing having an enclosure 22 containing the necessary internal electrical lighting components. The front and back covers 14, 16 can use a plurality of finger clips (not shown) to hold them in assembly with the central rectangularly shaped frame 12. The exit sign 10 is preferably molded from a plastic resin such as an engineering type thermoplastic such as ABS, polycarbonate or polyphelyene oxide but it should be apparent to those skilled in the art that they may be manufactured from other suitable materials.

The enclosure 22 of the exit sign 10 is divided into a wiring compartment 24 and a lighting compartment 26 by a retaining wall 28 which extends around the interior sides and top of the central rectangularly shaped frame 12. In a manner explained further hereinafter, the wiring compartment 24 contains an appropriate wiring harness 30 and battery power pack module 32 for powering two 1-watt direct current light emitting diode lighting devices 34 held by standard screw type lamp sockets 36 extending downwardly into the lighting compartment 26 from an upper part of the retaining wall 28.

Figure 4:
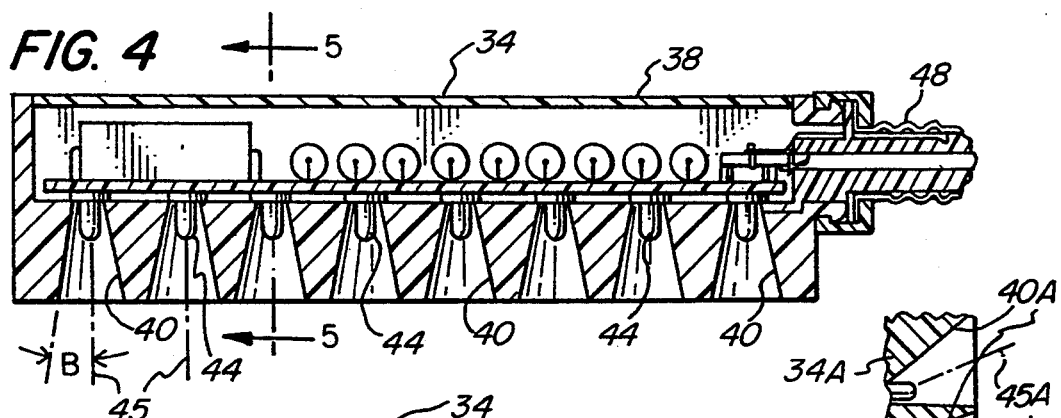
FIG. 4 is a cross-sectional view of the light emitting diode lighting device taken along the 4—4 line of FIG. 3.
Figure 5:
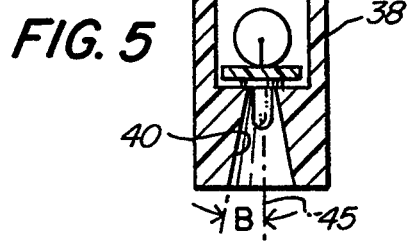
FIG. 5 is a cross-sectional view of the light emitting diode lighting device taken along the 5—5 line of FIG. 4.
Figure 6:
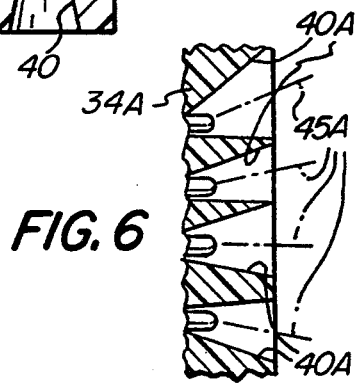
FIG. 6 is a fragmentary cross-sectional view of a second embodiment of the light emitting diode lighting device which has its frustoconical shaped apertures orientated at various angles relative to one another.
Figure 7:
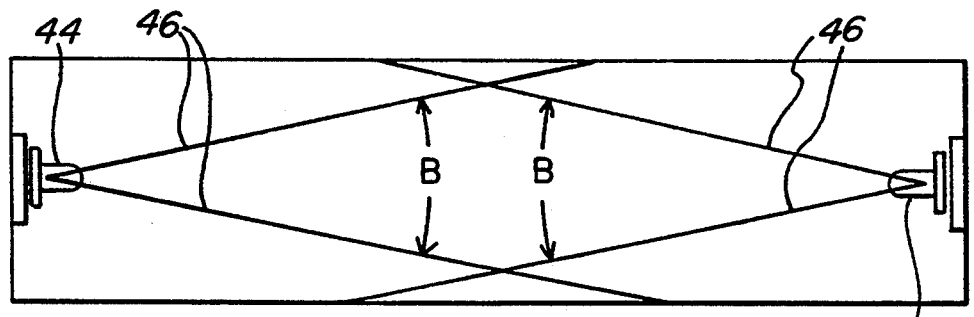
FIGS. 7 and 8 are illustrations of the illumination patterns of the exit sign of FIG. 1 as viewed respectively from above and on one side.
Figure 8:
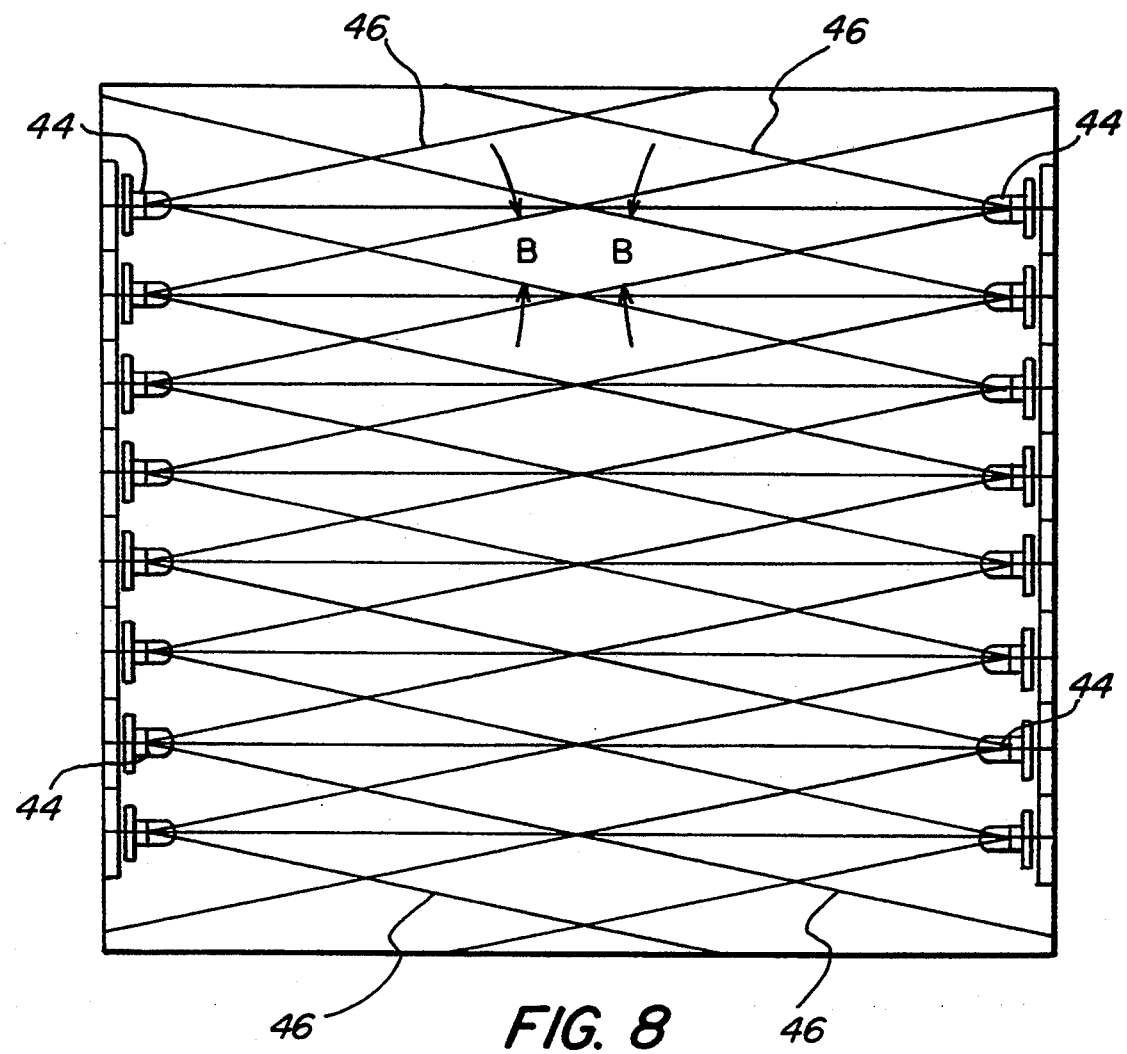

Referring to FIGS. 2–5 taken in conjunction with FIG. 1, each of the light emitting diode lighting devices 34 has an elongated rectangular plastic housing 38 having a plurality of frustoconical apertures 40 along one side thereof which communicate with an enlarged slot 41 on the other side of the housing 34. Inside the enlarged slot 41 in the elongated rectangular plastic housing 38 is a printed circuit board 42 with a plurality of light emitting diodes 44 thereon. One light emitting diode 44 is positioned to extend into each of the frustoconical apertures 40. Each of the frustoconical apertures 40 is of the right triangular cone variety and forms a twenty-three degree (23°) angle B with its vertex 45 to direct light rays 46 from the light emitting diodes 44 in an appropriate illumination pattern as shown in FIGS. 7–8 to provide full illumination for the stencil 18. The vertices 45 of the frustoconical apertures 40 can be aligned in a parallel manner as shown in FIG. 4. However, referring FIG. 6, in a second embodiment of the light emitting diode lighting device of the present invention designated by the numeral 34A, the vertices 45A of the cone shaped apertures 40A can be orientated at various angles relative to one another whereby various illumination patterns can be achieved.

The plastic housing 38 can be made of a translucent material to permit some of the light rays to emanate therethrough. Alternatively, the plastic housing 38 can be made of clear plastic material with the frustoconical apertures 40 coated with a white paint to let red spectrum light therethrough to reflect some of the light rays 46 and let some therethrough. The plastic housing 38 can be made of an opaque material such as polyphenylene oxide (NORYL N-190 made by General Electric) and polycarbonate (XANTAR G4F-23R made by DSM Polymers & Hydrocarbons BV).

As illustrated in FIGS. 1, 4 and 7–8, in order for light rays from the light emitting diode lighting devices 34 to evenly illuminate the stencil 18 when they pass through the diffuser 20, the frustoconical apertures 40 of the light emitting diode lighting devices 34 with the light emitting diodes 44 therein have to face one another. To obtain this type of alignment, the light emitting diode lighting devices 34 are provided with mounting base assemblies 48 which permit adjustment of the elongated rectangular plastic housings 38 relative to the mounting base assemblies 48 once the assemblies 48 are fully inserted and tightened into their respective screw-type lamp sockets 36. The adjustment of the elongated rectangular plastic housings 38 relative to the mounting base assemblies 48 is described in a copending U.S. patent application Ser. No. 08/260,423 (Ware, Fressola, Van Der Sluys & Adolphson Docket No. 64-151) entitled MOUNTING BASE ASSEMBLY FOR A LIGHTING DEVICE USED IN AN EXIT SIGN by inventors Charles R. Ruskouski and James J. Burnes, which is hereby incorporated by reference, with particular reference to FIGS. 3 and 4 and the description thereof.

Figure 9:
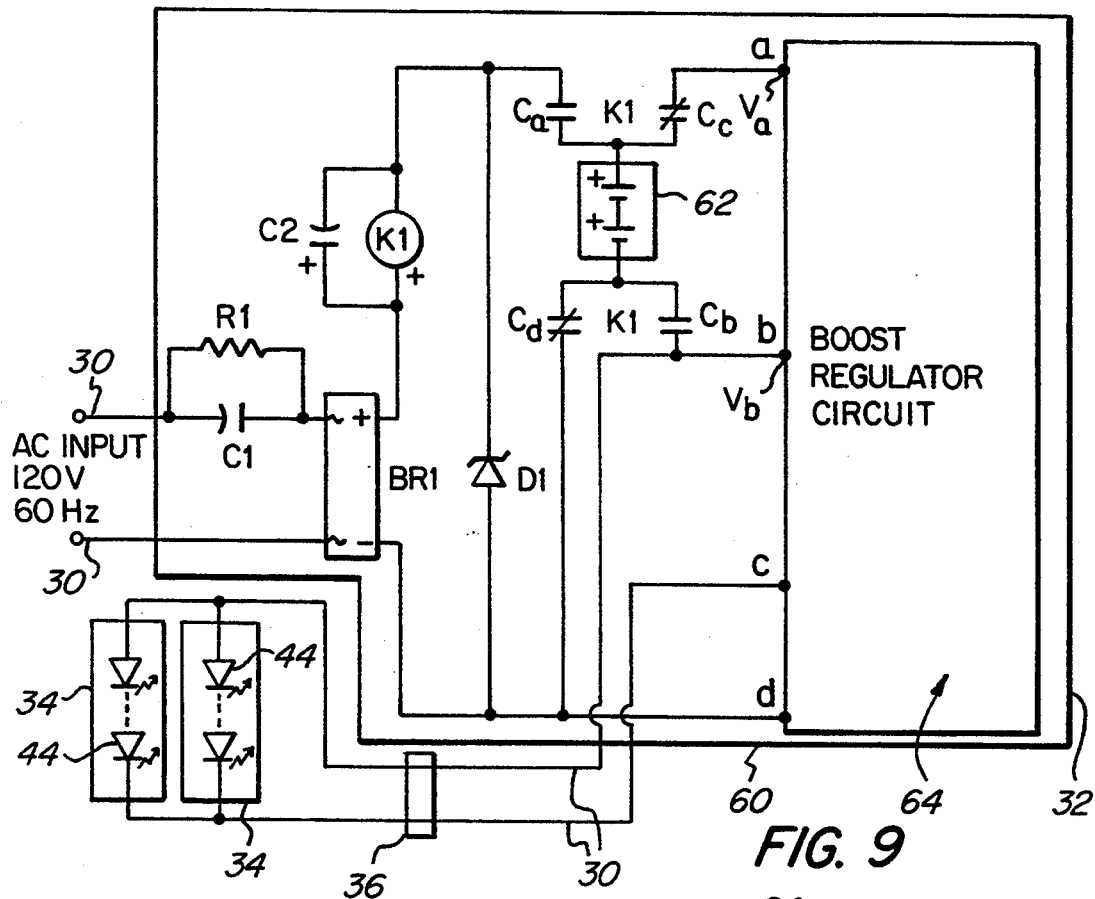
FIGS. 9 and 9A show an electrical schematic for the exit sign of FIG. 1.
Figure 9A:
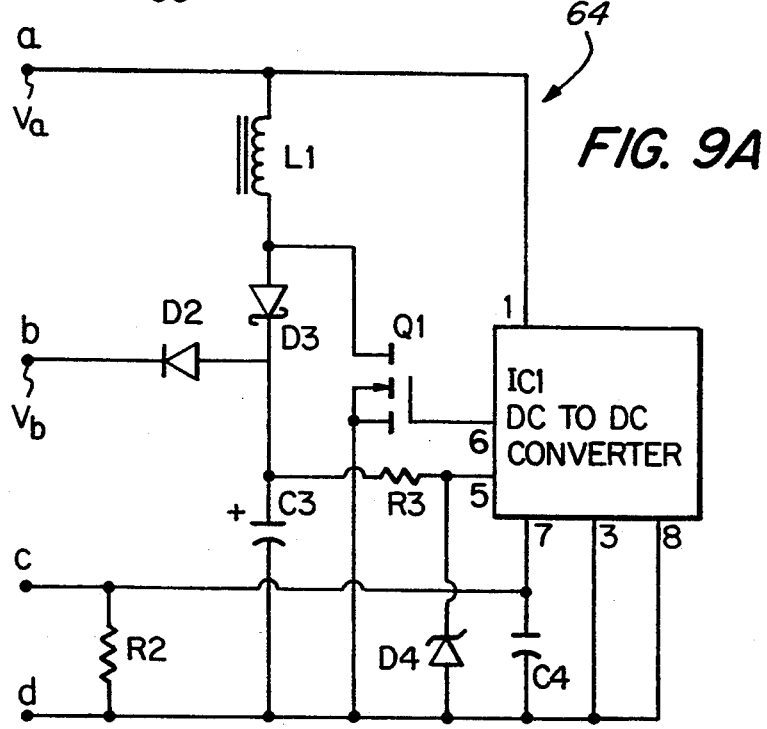

Turning now to FIGS. 9 and 9A taken in conjunction with FIG. 1, to power the light emitting diode lighting devices 34, the utility power (120 VAC) is provided to the wiring harness 30 through electrical leads (not shown) which extend into an electrical junction box (not shown) found in the ceiling or wall of the building. The battery power pack module 32 is electrically connected to the wiring harness 30 and incorporates a battery charger and converter circuit 60. The circuit 60 is designed in a manner well known to those skilled in the art to rectify the utility power into direct current and charge an auxiliary rechargeable battery pack 62. The circuit 60 also is designed to switch between the primary alternating current power supply and the emergency direct power supply provided by the rechargeable battery pack if the alternating current power supply fails as would be the case during a utility power outage.

During normal operation, utility power on the wiring harness 30 energizes the light emitting diodes 44 and maintains a charge on the battery pack 62 and, during emergency operation when the utility power fails, the battery pack 62 energizes the light emitting diodes 44 until utility power resumes on the wiring harness 30.

When the utility power is supplied on the wiring harness 30, the alternating current is first passed through a current limiting resistor R1 and capacitor C1 and is then passed through a bridge circuit BR1 which rectifies the alternating current into direct current. If the utility power fails, the current in the capacitor C1 discharges through the resistor R1 to prevent electrical shocks. The direct current from the bridge circuit BR1 initially flows through a Zener diode D1 and energizes a coil K1 for closing contacts Ca and Cb and opening contacts Cc and Cd so that the battery pack 62 is connected in series with the coil K1 and the light emitting diodes 44, which are electrically connected in series, parallel or series parallel to one another. This maintains the closure of the contacts Ca and Cb, charges the battery pack 62 and energizes the light emitting diodes 44. At this point, no current flows through the Zener diode D1.

When the utility power is not supplied on the wiring harness 30, the coil K1 is deenergized, which opens the contacts Ca and Cb and closes the contacts Cc and Cd. This causes the battery pack 62 to discharge through a boost regulator circuit 64 (shown in detail in FIG. 9A) which boosts the battery voltage to a level sufficient to operate the light emitting diodes 44. For example, when the utility power is off, the direct current flows from the positive side of the battery pack 62 through the contact Cc, into point a and out point b of the boost regulator circuit 64, where the output voltage Vb is greater than the input voltage Va. The direct current then flows through the light emitting diodes 44, which are electrically connected across points b and c as shown, into point c and out point d of the boost regulator circuit 64, through the contact Cd and back to the negative side of the battery pack 62.

The boost regulator circuit 64 is well known in the art and one example is shown in FIG. 9A. It has an input voltage Va coupled to pin 1 of a DC-to-DC converter IC1 and to one side of an inductor L1. The other side of the inductor L1 is coupled to a drain of a FET transistor Q1 having its gate coupled to pin 6 and its source coupled to ground. A Schottky diode D3 is connected between the drain of the FET transistor Q1 and an output voltage Vb. In operation, the direct current passes into the boost regulator circuit 64 at point a, discharges through the inductor L1 and the diodes D2 and D3, and passes from the boost regulator circuit 64 at point b to the light emitting diodes 44. The inductor L1, the DC-to-DC converter IC1, the FET transistor Q1, the diodes D2 and D3 combined to boost the output voltage Vb so it is greater than the input voltage Va needed to provide the direct current to the light emitting diodes 44. Upon return from the light emitting diodes 44, the direct current passes into the boost regulator circuit 64 at point c, through a resistor R2 and passes from the boost regulator circuit 64 at point d. From there, the direct current passes through the contact Cd and back to the negative side of the battery pack 62 to complete the circuit. The Zener diode D4 fixes the voltage at pin 5 of the DC-to-DC converter IC1. A capacitor C4 filters out undesirable voltage surges at point c of the boost regulator circuit 64, pin 3 is a ground connection for the convertor IC1 and pin 8 is grounded since it is not being used.

Figure 10:
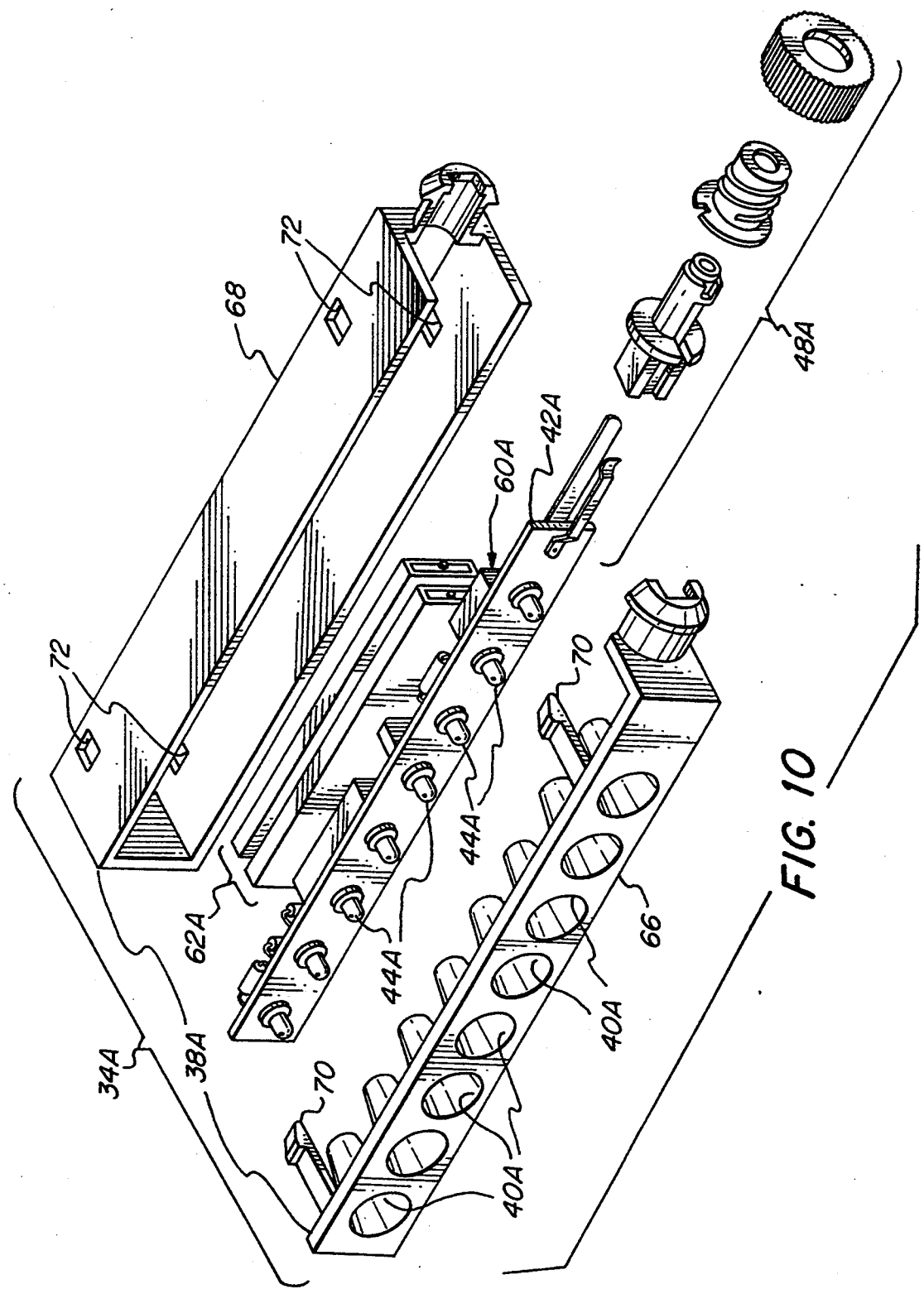
FIG. 10 is an exploded perspective view of a second embodiment of the light emitting diode device of the present invention.

Referring now to FIG. 10, therein is illustrated a second embodiment of the light emitting diode light device of the present invention which includes an alternative mounting arrangement for the electronic circuitry. In this second embodiment, essentially all components are identical to the arrangement in FIGS. 1–9 and like components have been designated with like reference numerals except for the addition of the reference character A.

As shown in FIG. 10, an elongated plastic housing 38A has front and rear portions 66, 68. The front portion 66 has frustoconical apertures 40A for light emitting diodes 44A and has spring clips 70 (only two shown) to interact with openings 72 in the rear portion 68 to hold the portions 66, 68 in assembly. A circuit board 42A is mounted inside the elongated plastic housing 38A and incorporates an appropriate battery charger and converter 60A thereon designed in a manner well known to those skilled in the art (see FIGS. 9 and 9A) to rectify the alternating current and to charge an auxiliary rechargeable battery pack 62A as well as to switch between the primary alternating current power supply and the emergency direct power supply provided by the rechargeable battery pack 62A if the alternating current power supply fails as would be the case during a utility power outage. The rechargeable battery pack 62A is also arranged inside the elongated plastic housing 38A. With both of the light emitting diode lighting devices used in an exit sign each having their own circuit 60A and battery pack 62A inside their elongated plastic housings 38A, the battery power pack module 32 of FIG. 1 can be eliminated from the exit sign.

It will therefore be seen from the above that the present invention provides an effective light emitting diode lighting device within an exit sign. The exit sign using the light emitting diode lighting devices has the same amount of illumination as found in exit signs using traditional incandescent lamps while at the same time greatly reducing power consumption.

It will thus be seen that the objects set forth above, among those made apparent from the preceding description, are efficiently attained and, since certain changes may be made in the above product without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the invention which, as a matter of language, might be said to fall therebetween.

What is claimed is:

1. A lighting device for illuminating indicia of an exit sign having an enclosure with an electrical socket mounted therein, comprising:
   (a) a housing having a plurality of light directing apertures in one side thereof;
   (b) illumination means in said housing, said illumination means including a plurality of light emitting diodes mounted On circuit mounting means, at least one of said diodes recessed in each of said plurality of light directing apertures, whereby light from said light emitting diodes is directed by said light directing apertures into the enclosure to illuminate the indicia of the exit sign; and
   (c) a mounting base assembly on said housing for electrically connecting said illumination means to the exit sign, said mounting base assembly matingly received in the electrical socket of the exit sign through relative rotational and axial movement therebetween.

2. The lighting device in accordance with claim 1, wherein said light directing apertures have a frustoconical shape.

3. The lighting device in accordance with claim 2, wherein said frustoconical shape has an angle of about twenty three degrees with its vertex.

4. The lighting device in accordance with claim 1, wherein said apertures extend parallel to one another.

5. The lighting device in accordance with claim 1, wherein at least some of said apertures are skewed relative to one another.

6. The lighting device in accordance with claim 1, wherein said circuit mounting means is a printed circuit board.

7. The lighting device in accordance with claim 6, wherein said housing has a slot therein in which said printed circuit board is positioned.

8. The lighting device in accordance with claim 6, wherein said printed circuit board is electrically connected to said mounting base assembly.

9. The lighting device in accordance with claim 6, wherein said printed circuit board has electrical components thereon for said illumination means.

10. The lighting device in accordance with claim 1, wherein said mounting base assembly permits orientation of said housing relative to said mounting base assembly.

11. An exit sign, comprising:
(a) a sign housing defining an enclosure therein and having indicia to be illuminated;
(b) an electrical socket in said sign housing; and
   (i) a lighting device housing having a plurality of light directing apertures in one side thereof;
   (ii) illumination means in said lighting device housing, said illumination means including a plurality of light emitting diodes mounted on a printed circuit board, said lighting device housing having a slot therein in which said printed circuit board is positioned, at least one of said diodes recessed in each of said plurality of light directing apertures, whereby light from said light emitting diodes is directed by said light directing apertures into said enclosure of said sign housing to illuminate said indicia; and
   (iii) a mounting base assembly on said lighting device housing for electrically connecting said illumination means to said electrical socket, said mounting base assembly matingly received in said electrical socket through relative rotational and axial movement therebetween.

12. The exit sign in accordance with claim 11, wherein said light directing apertures have a frustoconical shape.

13. The exit sign in accordance with claim 12, wherein said frustoconical shape has an angle of about twenty three degrees with its vertex.

14. The exit sign in accordance with claim 11, wherein said apertures extend parallel to one another.

15. The exit sign in accordance with claim 11, wherein at least some of said apertures are skewed relative to one another.

16. The exit sign in accordance with claim 15, wherein said printed circuit board is electrically connected to said mounting base assembly.

17. The exit sign in accordance with claim 15, wherein said printed circuit board has electrical components thereon for said illumination means.

18. The exit sign in accordance with claim 11, wherein said mounting base assembly permits orientation of said lighting device housing relative to said mounting base assembly and said sign housing.

19. The exit sign in accordance with claim 11, further including a primary electric power circuit operationally connected to said electrical socket for supplying power to said lighting device and emergency electric power circuit operationally connected to said primary electric power circuit to detect failure thereof and thereafter provided auxiliary power to said lighting device through said electrical socket.

20. The exit sign in accordance with claim 19, wherein said emergency electric power supply is at least one rechargeable battery.

21. The exit sign in accordance with claim 20, wherein said emergency electric power circuit includes a charging device for keeping said at least one rechargeable battery fully charged during periods of nonuse.

22. An exit sign, comprising:
(a) a sign housing defining an enclosure with at least one electrical socket therein and having indicia to be illuminated; and
(b) at least one lighting device within said enclosure for illuminating said indicia, each lighting device comprising:
   (i) a lighting device housing having a plurality of light directing apertures in one side thereof;
   (ii) illumination means in said lighting device housing, said illumination means including a plurality of light emitting diodes mounted on circuit mounting means, at least one of said diodes recessed in each of said plurality of light directing apertures, whereby light from said light emitting diodes is directed by said light directing apertures into said enclosure of said sign housing to illuminate said indicia; and.
   (iii) mounting base means on said lighting device housing for electrically connecting said illumination means to said at least one electrical socket, said mounting base means permitting relative movement between said lighting device housing and said at least one electrical socket.

23. The exit sign in accordance with claim 22, wherein said at least one electrical socket is two electrical sockets spaced apart within said enclosure and said at least one lighting device is two lighting devices spaced from one anther within said enclosure to fully illuminate said indicia.

24. The exit sign in accordance with claim 23, wherein said two lighting devices have their respective apertures facing one another.

25. The exit sign in accordance with claim 22, wherein said light directing apertures have a frustoconical shape.

26. The exit sign in accordance with claim 25, wherein said frustoconical shape has an angle of about twenty three degrees with its vertex.

27. The exit sign in accordance with claim 22, wherein said apertures extend parallel to one another.

28. The exit sign in accordance with claim 22, wherein at least some of said apertures are skewed relative to one another.

29. The exit sign in accordance with claim 22, wherein said circuit mounting means is a printed circuit board.

30. The exit sign in accordance with claim 29, wherein said lighting device housing has a slot therein in which said printed circuit board is positioned.

31. The exit sign in accordance with claim 29, wherein said printed circuit board has electrical components thereon for said illumination means.

32. The exit sign in accordance with claim 22, wherein said mounting base means permits orientation of said lighting device housing relative to said sign housing.

33. The exit sign in accordance with claim 22, further including a primary electric power circuit operationally connected to said at least one lighting device for supplying power to said at least one lighting device and emergency electric power circuit operationally connected to said primary electric power circuit to detect failure thereof and thereafter provided auxiliary power to said at least one lighting device.

34. The exit sign in accordance with claim 33, wherein said emergency electric power circuit includes at least one rechargeable battery.

35. The exit sign in accordance with claim 34, wherein said emergency electric power circuit includes a charging device for keeping said at least one rechargeable battery fully charged during periods of nonuse.

36. The exit sign in accordance with claim 34, wherein said rechargeable battery is mounted within said lighting device housing.

37. The exit sign in accordance with claim 33, wherein said emergency electric power circuit is mounted within said lighting device housing.

* * * * *